United States Patent
Hong et al.

(10) Patent No.: US 8,049,268 B2
(45) Date of Patent: Nov. 1, 2011

(54) DIELECTRIC STRUCTURE IN NONVOLATILE MEMORY DEVICE AND METHOD FOR FABRICATING THE SAME

(75) Inventors: Kwon Hong, Ichon-shi (KR); Kwan-Yong Lim, Ichon-shi (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/748,967

(22) Filed: Mar. 29, 2010

(65) Prior Publication Data
US 2010/0181611 A1   Jul. 22, 2010

Related U.S. Application Data

(62) Division of application No. 11/264,028, filed on Nov. 2, 2005, now Pat. No. 7,741,170.

(30) Foreign Application Priority Data

Jun. 29, 2005 (KR) .................. 10-2005-0056952

(51) Int. Cl.
*H01L 29/788* (2006.01)
(52) U.S. Cl. ...................... 257/316; 257/29.3
(58) Field of Classification Search .................. 257/316, 257/E29.3, 315, 303, 304, 310, 311
See application file for complete search history.

(56) References Cited

U.S. PATENT DOCUMENTS

| 6,660,660 | B2 * | 12/2003 | Haukka et al. | 438/778 |
| 7,465,626 | B2 * | 12/2008 | Chen et al. | 438/240 |

* cited by examiner

*Primary Examiner* — Hoa B Trinh
(74) *Attorney, Agent, or Firm* — IP & T Group LLP

(57) ABSTRACT

A dielectric structure in a nonvolatile memory device and a method for fabricating the same are provided. The dielectric structure includes: a first oxide layer; a first high-k dielectric film formed on the first oxide layer, wherein the first high-k dielectric film includes one selected from materials with a dielectric constant of approximately 9 or higher and a compound of at least two of the materials; and a second oxide layer formed on the first high-k dielectric film.

9 Claims, 7 Drawing Sheets

DIELECTRIC STRUCTURE IN NONVOLATILE MEMORY DEVICE AND METHOD FOR FABRICATING THE SAME

This application is a division of U.S. patent application Ser. No. 11/264,028 filed on Nov. 2, 2005, now U.S. Pat. No. 7,741,170 which claims priority of Korean patent application number 10-2005-0056952 filed on Jun. 29, 2005. The disclosure of each of the foregoing applications is incorporated herein by reference in its entirety.

FIELD OF THE INVENTION

The present invention relates to a semiconductor memory device and a method for fabricating the same; and, more particularly, to a dielectric structure such as an inter poly dielectric (IPD) or an inter poly oxide (IPO), which exists between a floating gate and a control gate in a nonvolatile memory device, and a method for fabricating the same.

DESCRIPTION OF RELATED ARTS

Unlike a dynamic random access memory (DRAM) device, a flash memory device, which is a nonvolatile memory device, does not require a capacitor device. Instead, the flash memory device requires an electric charge storage space to read and write data. To perform such read and write operations, a ratio between entire capacitance including capacitance formed in a tunnel oxide layer and capacitance of a dielectric structure such as an inter-poly dielectric (IPD) or an inter-poly oxide (IPO) existing between a floating gate and a control gate must be satisfied.

However, as semiconductor devices are becoming highly integrated, a conventional oxide/nitride/oxide (ONO) structure shows limitations in securing enough capacitance. If the thickness of the ONO structure is reduced to secure the capacitance, a leakage current characteristic becomes deteriorated. As a result, introducing a material with a high dielectric constant is inevitable. However, if a high-k dielectric film is used as a single layer, the coupling ratio may become difficult to control. Therefore, a material with an appropriate dielectric constant is required.

SUMMARY OF THE INVENTION

It is, therefore, an object of the present invention to provide a dielectric structure of a nonvolatile memory device and a method for fabricating the same, wherein the dielectric structure is capable of: satisfying a required level of the coupling ratio in accordance with the decreasing design rule as memory devices have become highly integrated; securing a superior leakage current characteristic; and improving reliability.

In accordance with an aspect of the present invention, there is provided a dielectric structure in a nonvolatile memory device including a floating gate, the dielectric structure and a control gate, the dielectric structure including: a first oxide layer; a first high-k dielectric film formed on the first oxide layer, wherein the first high-k dielectric film includes one selected from materials with a dielectric constant of approximately 9 or higher and a compound of at least two of the materials; and a second oxide layer formed on the first high-k dielectric film.

In accordance with another aspect of the present invention, there is provided a method for fabricating a dielectric structure of a nonvolatile memory device, wherein the nonvolatile memory device includes a floating gate, the dielectric structure and a control gate, the method including: forming a first oxide layer on the floating gate; forming a first high-k dielectric film on the first oxide layer, wherein the first high-k dielectric film includes one selected from materials with a dielectric constant of approximately 9 or higher and a compound of at least two of the materials; and forming a second oxide layer on the first high-k dielectric film.

BRIEF DESCRIPTION OF THE DRAWINGS

The above and other objects and features of the present invention will become better understood with respect to the following description of the specific embodiments given in conjunction with the accompanying drawings, in which.

DETAILED DESCRIPTION OF THE INVENTION

Figure 1:
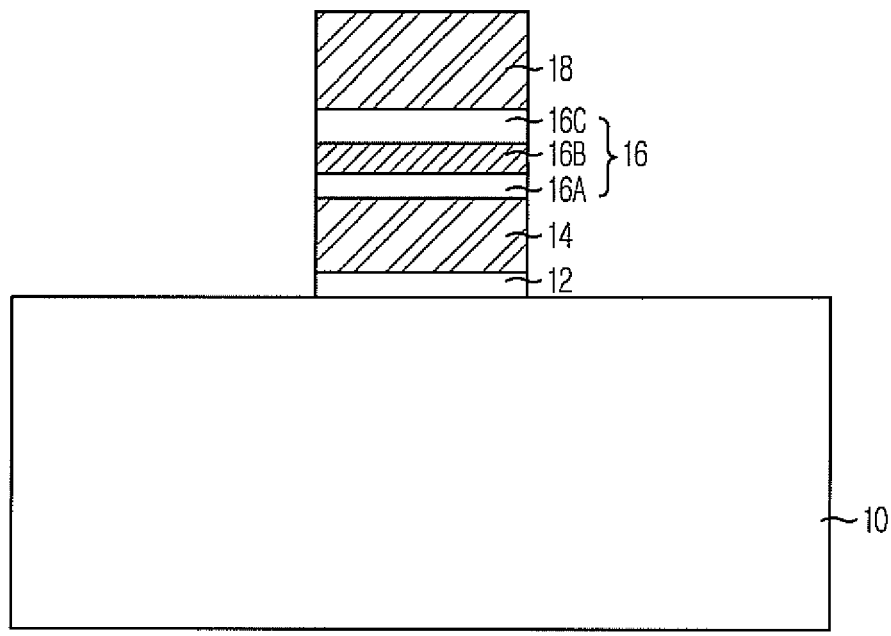
FIG. 1 is a cross-sectional view illustrating a dielectric structure in accordance with a first embodiment of the present invention.

A dielectric structure of a nonvolatile memory device and a method for fabricating the same in accordance with specific embodiments of the present invention will be described in detail with reference to the accompanying drawings. Also, regarding the drawings, illustrated thicknesses of layers and regions are exaggerated for definitude. When a first layer is referred to as being on a second layer or "on" a substrate, it could mean that the first layer is formed right on the second layer or the substrate, or it could also mean that a third layer may exit between the first layer and the substrate. Furthermore, identical reference numerals throughout the specific embodiments of the present invention represent identical elements.

FIG. 1 is a cross-sectional view illustrating a gate electrode in a flash memory device in accordance with a first embodiment of the present invention. Herein, the gate electrode has a stack structure and is illustrated as an example to describe a dielectric structure in a nonvolatile memory device.

Referring to FIG. 1, the dielectric structure 16 of the nonvolatile memory device is formed with a layered structure of: a first oxide layer 16A, a high-k dielectric film 16B and a second oxide layer 16C.

The first oxide layer 16A and the second oxide layer 16C are high temperature oxide layers, which are formed in a thickness ranging from approximately 30 Å to approximately 60 Å by employing superior internal pressure and dichlorosilane ($SiH_2Cl_2$) and hydrogen oxide ($H_2O$) gases both having a superior time dependent dielectric breakdown (TDDB) characteristic. Furthermore, the high-k dielectric film 16B is formed by employing a material with a dielectric constant of equal to or greater than approximately 9 or a compound of such materials with an appropriate feeding ratio.

In an article by G. D. Wilk et al. (*Journal of Applied Physics*, vol. 89 (10), pp. 5243-5275, 2001), such dielectric materials and their characteristics are disclosed. Table 1 shows this disclosure in detail.

TABLE 1

| Material | Dielectric constant (k) | Band gap Eg(eV) | Crystal structure(s) |
|---|---|---|---|
| $SiO_2$ | 3.9 | 8.9 | Amorphous |
| $Si_3N_4$ | 7 | 5.1 | Amorphous |
| $Al_2O_3$ | 9 | 8.7 | Amorphous |
| $Y_2O_3$ | 15 | 5.6 | Cubical |
| $La_2O_3$ | 30 | 4.3 | Hexagonal, Cubical |
| $Ta_2O_5$ | 26 | 4.5 | Orthorhombic |
| $TiO_2$ | 80 | 3.5 | Tetragonal (rutile, anatase) |
| $HfO_2$ | 25 | 5.7 | Monoclinic, Orthorhombic, Cubical |
| $ZrO_2$ | 25 | 7.8 | Monoclinic, Orthorhombic, Cubical |

As shown in Table 1, the high-k dielectric film 16B is formed by employing one from a group consisting of aluminum oxide ($Al_2O_3$), yttrium oxide ($Y_2O_3$), lanthanum oxide ($La_2O_3$), tantalum oxide ($Ta_2O_5$), titanium oxide ($TiO_2$), hafnium oxide ($HfO_2$), and zirconium oxide ($ZrO_2$). Preferably, one of $Al_2O_3$, $Y_2O_3$, $HfO_2$, and $ZrO_2$ with a dielectric constant ranging from approximately 9 to 25 is used. Meanwhile, a dielectric constant of $La_2O_3$, $Ta_2O_5$, and $TiO_2$ ranges from approximately 26 to 80. The high-k dielectric film 16B is also formed by employing a compound of two chosen from a group consisting of $Al_2O_3$, $Y_2O_3$, $La_2O_3$, $Ta_2O_5$, $TiO_2$, $HfO_2$, and $ZrO_2$ with appropriate feeding ratio. For example, the high-k dielectric film 16B is formed by employing one compound from a group consisting of $HfO_xAl_yO_z$, $ZrO_xAl_yO_z$ and $LaO_xAl_yO_z$. Herein, x, y and z are 0 or natural numbers, representing feeding ratios of atoms composing the individual compounds.

Figure 2:
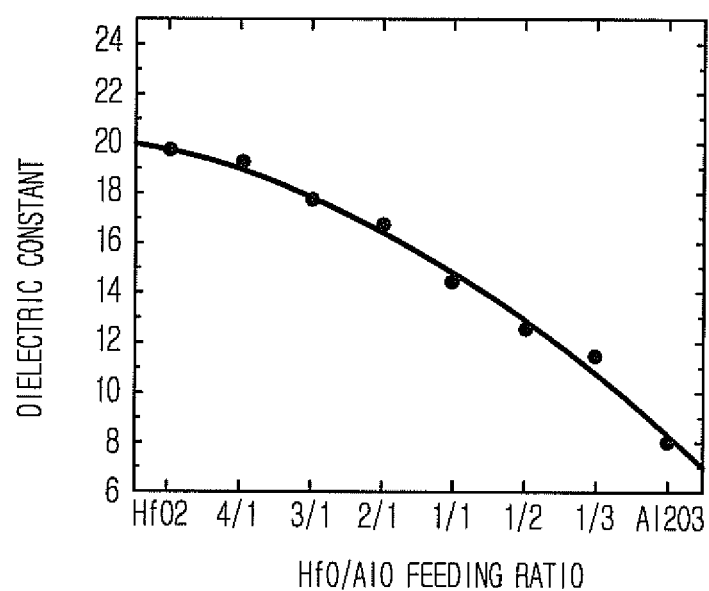
FIG. 2 is a graph illustrating a dielectric characteristic of a hafnium oxide-aluminum oxide ($HfO_2$—$Al_2O_3$)-based thin film.

For example, as shown in FIG. 2, the dielectric constant of $HfO_xAl_yO_z$ can be controlled to be within a range of approximately 9 to 20 according to the feeding ratio, that is, a mixing rule. Therefore, instead of a nitride-based layer, $HfO_xAl_yO_z$ with a controlled thickness and feeding ratio can be interpositioned in a dielectric structure of a conventional ONO structure to satisfy electrical and physical characteristics such as a leakage current.

As described above, it is preferable to use an $HfO_2$—$Al_2O_3$-based thin film with superior step coverage, which allows an easy dielectric constant control to satisfy a physical thickness limit and an electrical oxide thickness (EDT) required by each device, as well as a leakage current characteristic.

As shown in FIG. 2, the $HfO_2$—$Al_2O_3$-based thin film can convert the dielectric constant freely within a range of approximately 9 to 20 according to the feeding ratio, that is, the mixing rule. However, if only a single high-k dielectric structure is used instead of the ONO layer, the dielectric constant becomes too high, and the coupling ratio cannot be controlled. Thus, the $Hfo_2$-$Al_2O_3$-based thin film with an appropriate thickness and feeding ratio is inserted in the ONO layer structure instead of the nitride-based layer, to satisfy electrical and physical characteristics required by the device. On the other hand, the reference numerals 10, 12, 14, and in FIG. 1 which are not described above, represent a substrate, a tunnel oxide layer, a first polysilicon layer for use in a floating gate, and a second polysilicon layer for use in a control gate, respectively.

Figure 3:
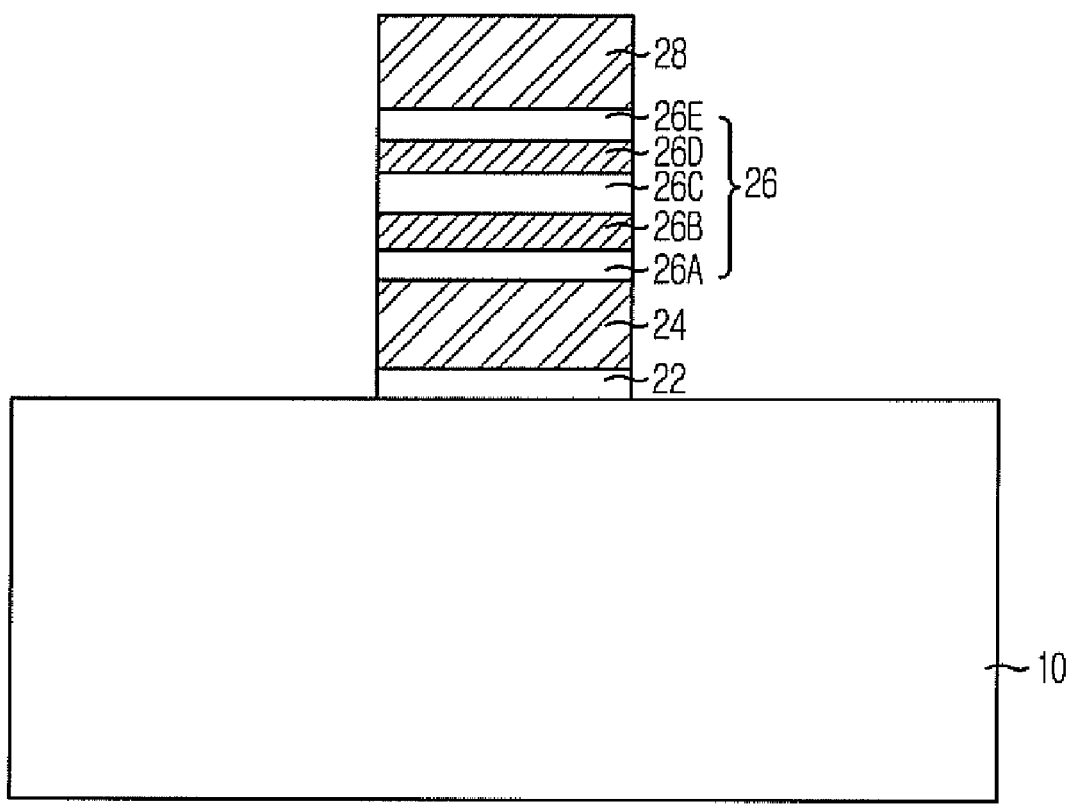
FIG. 3 is a cross-sectional view illustrating a dielectric structure in accordance with a second embodiment of the present invention.

FIG. 3 is a cross-sectional view illustrating a gate electrode of a flash memory device in accordance with a second embodiment of the present invention. Herein, the gate electrode has a stack structure and is illustrated as an example to describe a dielectric structure of a nonvolatile memory device.

Referring to FIG. 3, different from the dielectric structure 16 in FIG. 1, the dielectric structure 26 of the nonvolatile memory device is formed with a layered structure of: a first oxide layer 26A, a first high-k dielectric film 26B, a second oxide layer 26C, a second high-k dielectric film 26D, and a third oxide layer 26E. The first oxide layer to the third oxide layer 26A, 26C and 26D of the dielectric structure are high temperature oxide layers formed as described in the first embodiment. Furthermore, the first high-k dielectric film 26B and the second high-k dielectric film 26D are formed of a material identical to the high-k dielectric film 16B described in the first embodiment, or a compound of such materials.

Hereinafter, a method for fabricating the dielectric structure of the nonvolatile memory device in accordance with the first embodiment is described with reference to FIGS. 4A to 4E.

Figure 4A:
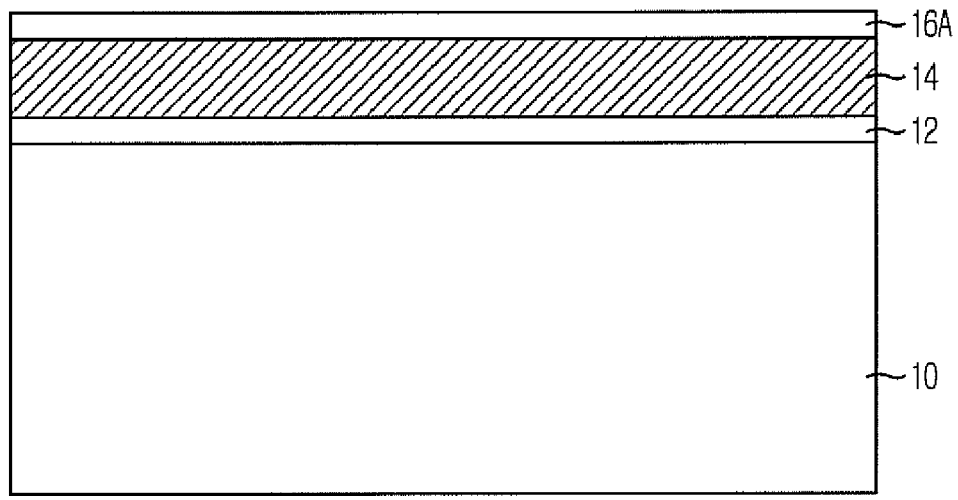
FIGS. 4A to 4E are cross-sectional views illustrating a method for fabricating the dielectric structure in accordance with the first embodiment of the present invention.

As shown in FIG. 4A, the tunnel oxide layer 12 (or a gate oxide layer) is formed on the substrate 10 whereon a semiconductor structure is formed through a series of fabrication processes. Herein, the tunnel oxide layer 12 is formed by employing a dry oxidation method or a wet oxidation method. For example, the wet oxidation method forms the tunnel oxide layer 12 by performing a wet oxidation process at a temperature ranging from approximately 750° C. to approximately 800° C. and then performing an annealing process for approximately 20 minutes to approximately 30 minutes in nitrogen ($N_2$) atmosphere at a temperature ranging from approximately 900° C. to approximately 910° C.

Meanwhile, the semiconductor structure includes a device isolation region formed by a shallow trench isolation (STI) process and a well region formed by an ion implantation process.

Subsequently, the first polysilicon layer 14 for a floating gate is formed on the tunnel oxide layer 12. Herein, the first polysilicon layer 14 is formed by employing one of doped polysilicon and undoped polysilicon. For example, the first polysilicon layer 14 can be formed in a thickness ranging from approximately 500 Å to approximately 2,000 Å by a low pressure chemical vapor deposition (LPCVD) method using silane ($SiH_4$) or disilane ($Si_2H_6$) and phosphine ($PH_3$) gases. Herein, it is preferable to form the first polysilicon layer 14 with a minimized grain size. For example, the first polysilicon layer 14 is formed at a temperature ranging from approximately 580° C. to approximately 620° C. with a low pressure ranging from approximately 0.1 Torr to approximately 3 Torr.

Furthermore, the first oxide layer 16A is formed on the first polysilicon layer 14. Herein, the first oxide layer 16A is a high temperature oxide layer formed in a thickness ranging from approximately 30 Å to approximately 60 Å by employing a superior internal pressure and $SiH_2Cl_2$ and $H_2O$ gases as source gases with a superior TDDB characteristic.

Figure 4B:
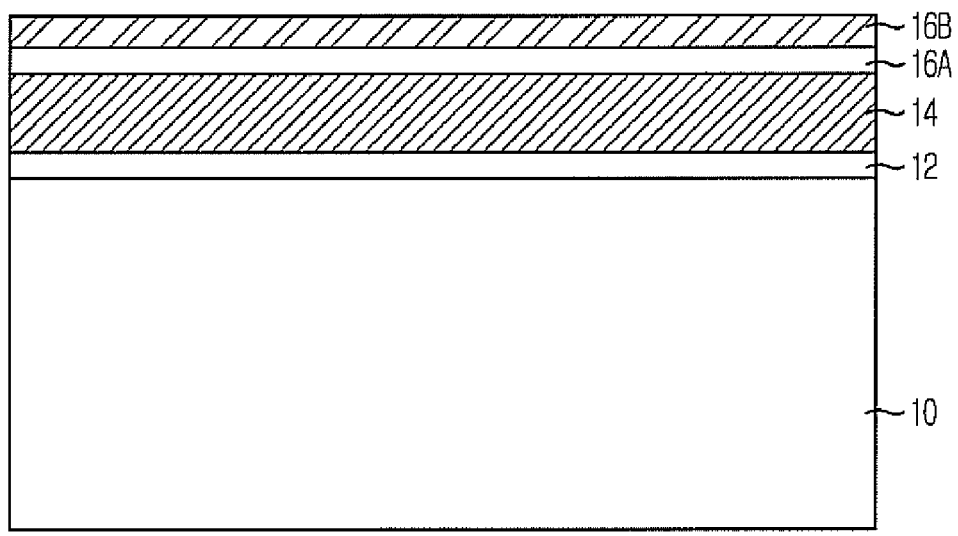

Then, as shown in FIG. 4B, the high-k dielectric film 16B is formed on the first oxide layer 16A using an atomic layer deposition (ALD) method with superior step-coverage. Herein, the high-k dielectric film 16B is an $HfO_2$—$Al_2O_3$-based thin film, formed in a thickness ranging from approximately 30 Å to approximately 100 Å. A feeding ratio of hafnium (Hf) to aluminum (Al) in the $HfO_2$—$Al_2O_3$-based thin film ranges from approximately 1:9 to approximately 9:1, and the feeding ratio can be altered continuously within the aforementioned range. Detailed description of the ALD method will be described later.

Figure 4C:
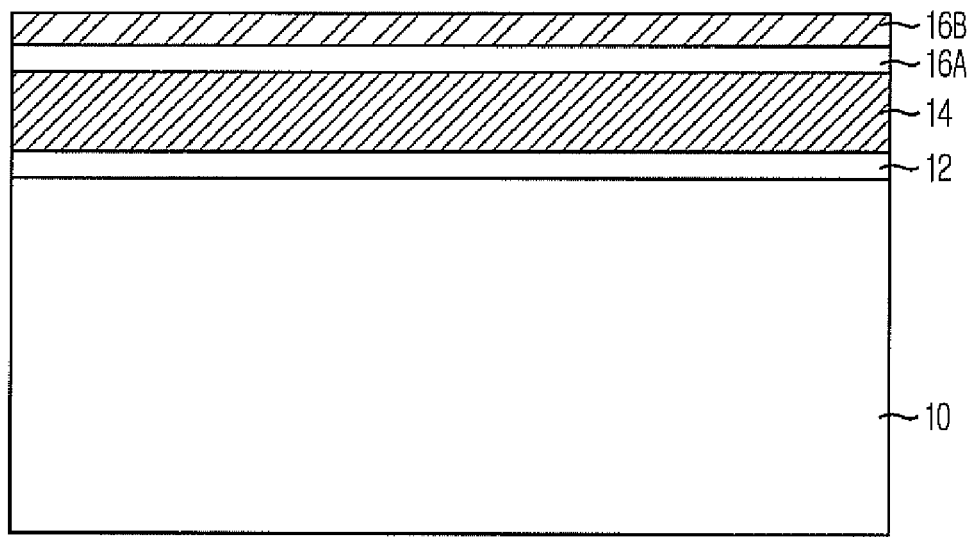

As shown in FIG. 4C, a heat treatment process 17 is performed on the high-k dielectric film 16B for densification and to resolve oxygen shortage of the high-k dielectric film 16B. Herein, the heat treatment process 17 is performed by employing one from a group consisting of a furnace method, a rapid temperature process (RTP) method and a rapid temperature annealing (RTA) method. Herein, the heat treatment process 17 is performed in an atmosphere which includes a very small amount of $O_3$, Ar, $N_3$ or $O_2$. The heat treatment process 17 using $O_3$ is performed for approximately 10 seconds to approximately 120 seconds. The heat treatment process 17 using $O_2$ plasma is performed at a temperature ranging from approximately 100° C. to approximately 400° C. with a power ranging from approximately 100 W to approximately 1,000 W for approximately 10 seconds to approximately 60 seconds.

Figure 4D:
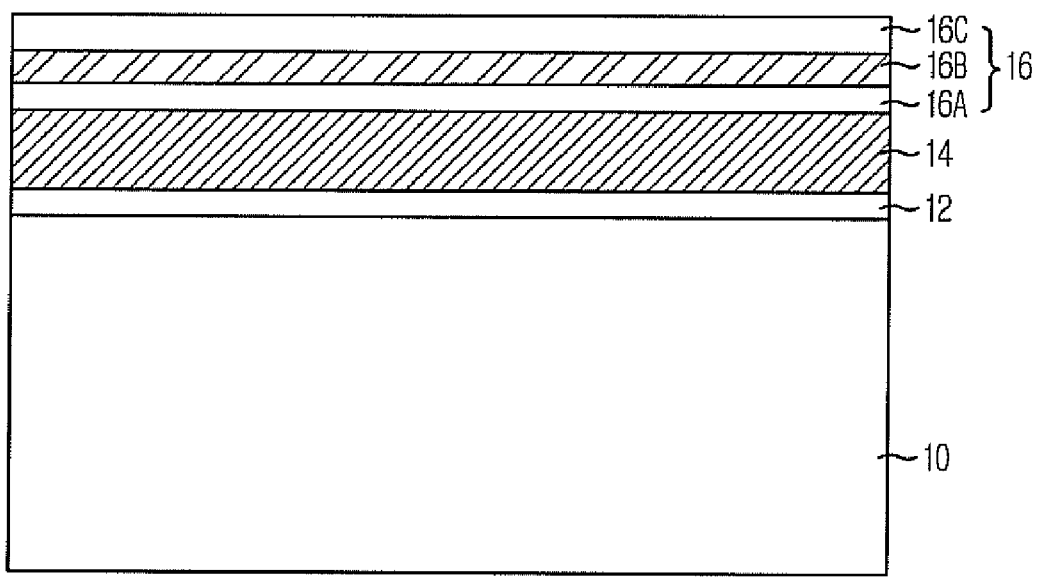

Furthermore, as shown in FIG. 4D, the second oxide layer 16C is formed on top of the high-k dielectric film 16B. Herein, the second oxide layer 16C is, just like the first oxide layer 16A, a high temperature oxide layer formed in a thickness ranging from approximately 30 Å to approximately 60 Å by employing a superior internal pressure and $SiH_2Cl_2$ and $H_2O$ gases as source gases with a superior TDDB characteristic. Thus, the dielectric structure 16 is formed, including: the first oxide layer 16A; the high-k dielectric film 16B; and the second oxide layer 16C.

Figure 4E:
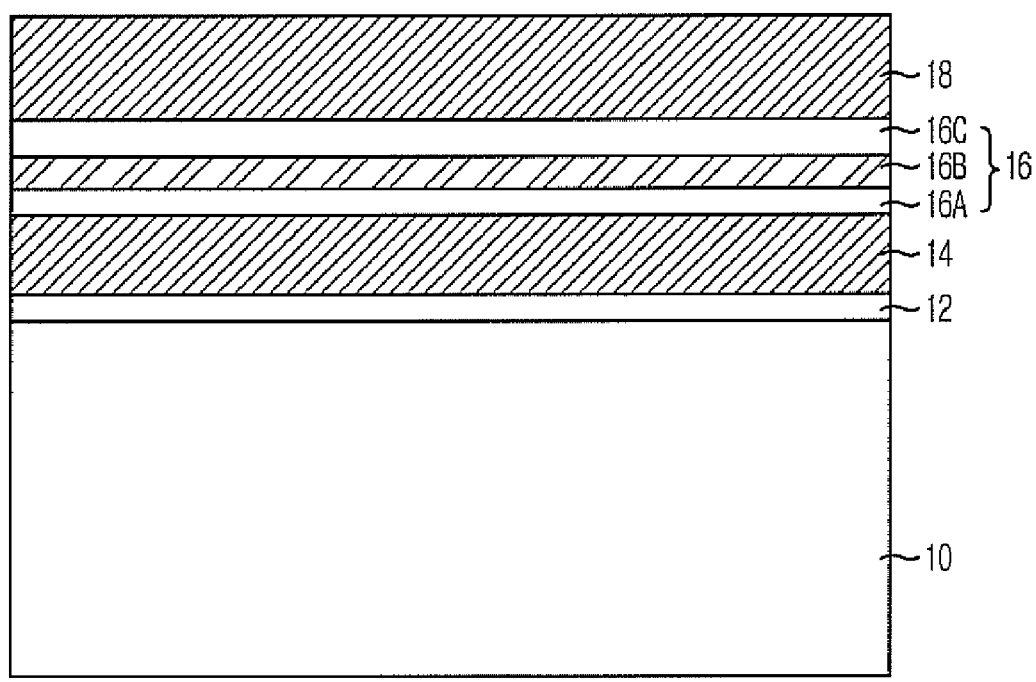

Moreover, as shown in FIG. 4E, the second polysilicon layer 18 for a control gate is formed on top of the dielectric structure 16. Herein, the second polysilicon layer 17 is, just like the first polysilicon layer 14, formed in a thickness of approximately 500 Å to approximately 2,000 Å by employing $SiH_4$ or $Si_2H_6$ and $PH_3$ gases.

Hereinafter, the aforementioned ALD method will be described in detail.

Figure 5:
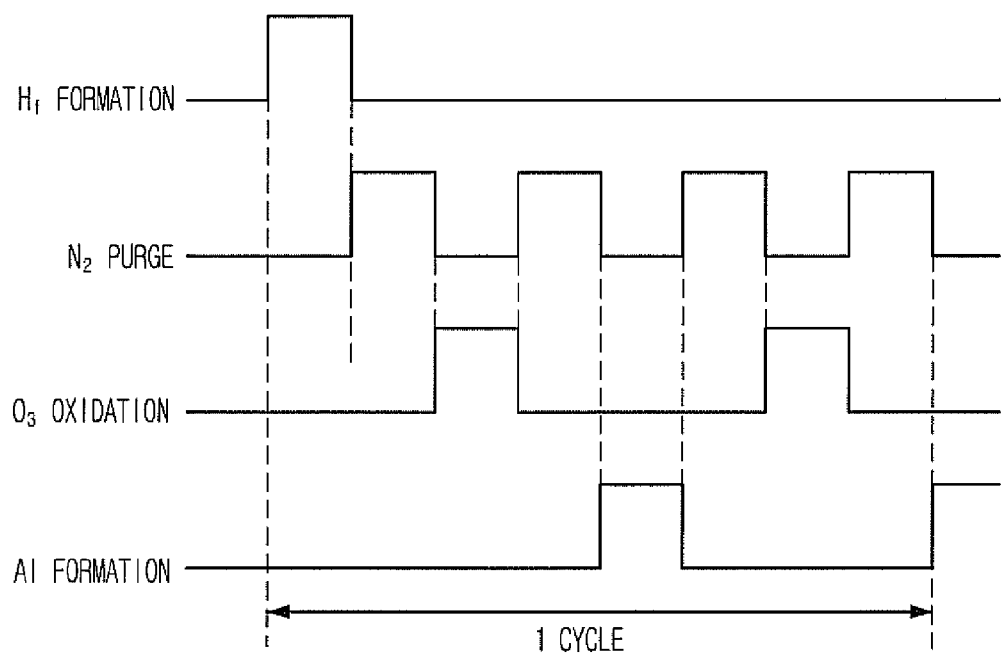
FIGS. 5 to 7 are flow diagrams illustrating a method for fabricating a high-k dielectric film using an atomic layer deposition (ALD) method in accordance with a specific embodiment of the present invention.

As shown in FIG. 5, the ALD process is performed in a sequential order of: Hf formation; $N_2$ purge; ozone ($O_3$) oxidation; $N_2$ purge; Al formation; $N_2$ purge; $O_3$ oxidation; and $N_2$ purge. In detail, a Hf source gas is implanted into an ALD chamber to form an Hf layer on a wafer, and then $N_{2\ gas}$ is supplied into the ALD chamber to purge the residual Hf source gas which was not used in the formation. Subsequently, $O_3$ gas is supplied into the ALD chamber for oxidizing the Hf layer to thereby form an $HfO_2$ thin film. Then, $N_2$ gas is supplied into the ALD chamber again to purge the residual $O_3$ gas which did not react. Next, an Al source gas is supplied into the ALD chamber to form an Al layer on an entire surface of the above resulting wafer structure including the $HfO_2$ thin film, and then, $N_2$ gas is supplied to purge the residual Al source gas, which was not used in the formation. Then, $O_3$ gas is supplied into the ALD chamber for oxidizing the Al layer formed on top of the above resulting wafer structure to thereby form an $Al_2O_3$ layer, and then, $N_2$ gas is again supplied into the ALD chamber to purge the residual $O_3$ gas which did not react.

Figure 6:
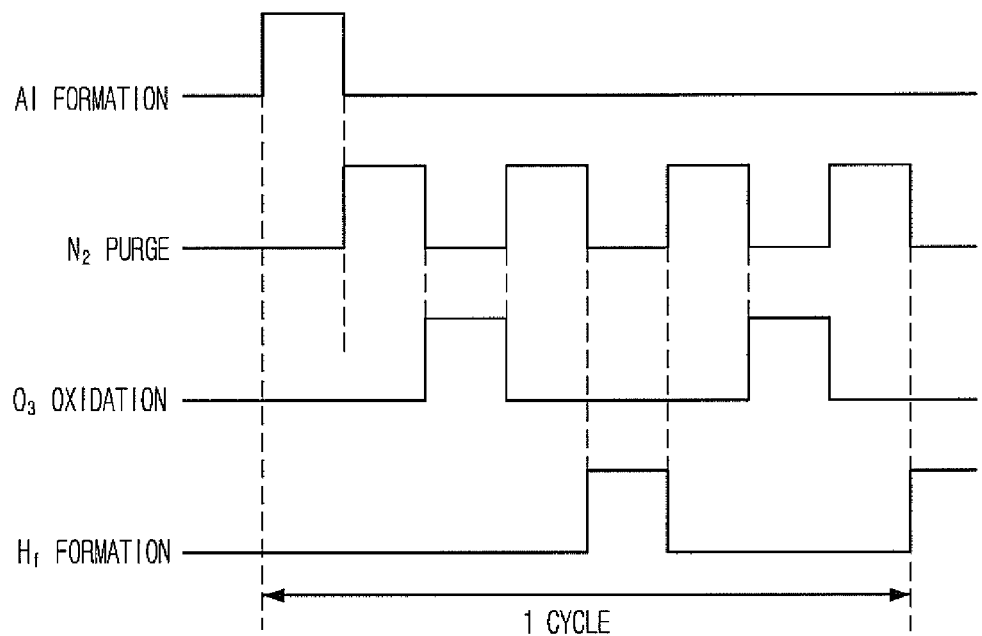

As shown in FIG. 6, the ALD process can be performed by another method in a sequential order of: Al formation; $N_2$ purge; $O_3$ oxidation; $N_2$ purge; Hf formation; $N_2$ purge; $O_3$ oxidation; and $N_2$ purge. In detail, an Al source gas is supplied into an ALD chamber to form an Al layer on a wafer, and then $N_2$ gas is supplied into the ALD chamber to purge the residual Al source gas which was not used in the formation. Subsequently, $O_3$ gas is supplied into the ALD chamber for oxidizing the Al layer to form an $Al_2O_3$ thin film. Then, $N_2$ gas is supplied again into the ALD chamber to purge the residual $O_3$ gas which did not react. Next, an Hf source gas is supplied into the ALD chamber to form a Hf layer on the above resulting wafer structure including the $Al_2O_3$ thin film, and then $N_2$ gas is supplied into the ALD chamber to purge the residual Hf source gas which was not used in the formation. Then, $O_3$ gas is supplied into the ALD chamber for oxidizing the Hf layer to form a $HfO_2$ film. Then $N_2$ gas is supplied again into the ALD chamber to purge the residual $O_3$ gas.

Figure 7:
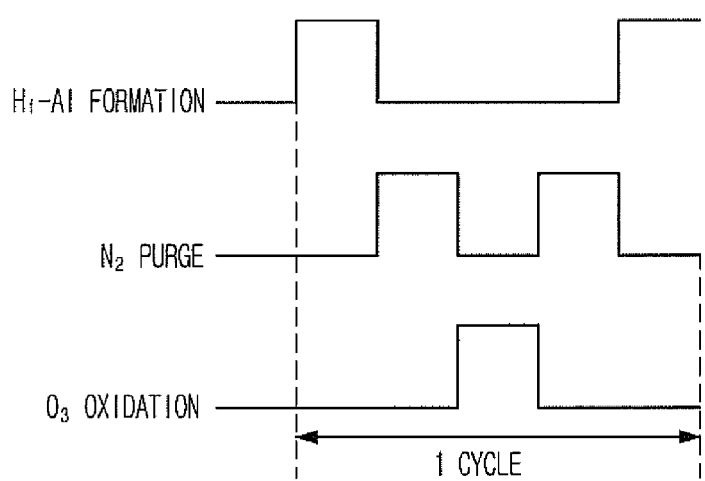

As shown in FIG. 7, the ALD process can be performed by still another method in a sequential order of: Hf—Al formation; $N_2$ purge; $O_3$ oxidation; and $N_2$ purge. That is, layers of Hf and Al are formed simultaneously, and then purge and oxidation processes are performed to form a $Hfo_2Al_2O_3$-based thin film.

Meantime, as shown in Table 1, the high-k dielectric film 16B can be formed of a material with a dielectric constant higher then the $Al_2O_3$ film (i.e., k>9) or a compound layer of such materials, other than the $Al_2O_3$ and $HfO_2$ layers.

The specific embodiments of the present invention described above only cover the case of a dielectric structure in a flash memory device. However, the flash memory device is one example of various applications. The embodiments of the present invention can be applied to other types of nonvolatile memory devices with a dielectric structure, including electrically erasable and programmable read only memory (EEPROM) and erasable and programmable read only memory (EPROM). The embodiments of the present invention can be also applied to fabrication processes of flash memory devices under 70 nm level, wherein a self-aligned-shallow trench isolation (SA-STI) process or a self-aligned floating gate (SAFG) is used.

In accordance with the specific embodiments of the present invention, the dielectric structure of a nonvolatile memory device such as the flash memory device is formed into the structure of: the first oxide layer; the high-k dielectric layer; and the second oxide layer. As a result, the coupling ratio required by the device is satisfied in accordance with the decreasing design rule as memory devices have become highly integrated, the superior leakage current characteristic is secured, and the reliability is improved.

The present application contains subject matter related to the Korean patent application No. KR 2005-0056952, filed in the Korean Patent Office on Jun. 29, 2005, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. A dielectric structure in a nonvolatile memory device including a floating gate, the dielectric structure and a control gate, the dielectric structure comprising:
   a first oxide layer;
   a first high-k dielectric film formed on the first oxide layer, wherein the first high-k dielectric film includes a compound of materials;
   a second oxide layer formed on the first high-k dielectric film;
   a second high-k dielectric film formed on the second oxide layer, wherein the second high-k dielectric film includes a compound identical to the compound of the first high-k dielectric film; and
   a third oxide layer formed on the second high-k dielectric film,
   wherein the compound of the first high-k dielectric film is chosen from a group consisting of $HfO_xAl_yO_z$, $ZrO_xAl_yO_z$ and $LaO_xAl_yO_z$, and x, y and z are natural numbers.

2. The dielectric structure of claim 1, wherein the first high-k dielectric film includes a material chosen from a group consisting of aluminum oxide ($Al_2O_3$), hafnium oxide ($HfO_2$), and Zirconium oxide ($ZrO_2$).

3. The dielectric structure of claim 1, wherein the first high-k dielectric film includes lanthanum oxide ($La_2O_3$).

4. The dielectric structure of claim 1, wherein the second high-k dielectric film includes a material chosen from a group consisting of $Al_2O_3$, $HfO_2$, and $ZrO_2$.

5. The dielectric structure of claim 1, wherein the second high-k dielectric film includes $La_2O_3$.

6. The dielectric structure of claim 1, wherein the first high-k dielectric film is formed in a thickness ranging from approximately 30 Å to approximately 100 Å.

7. The dielectric structure of claim 1, wherein the first high-k dielectric film and the second high-k dielectric film are formed in a thickness ranging from approximately 30 Å to approximately 100 Å.

8. The dielectric structure of claim 1, wherein the first oxide layer to the third oxide layer are high temperature oxide layers formed by employing dichlorosilane ($SiH_2Cl_2$) and hydrogen oxide ($H_2O$) gases.

9. The dielectric structure of claim 8, wherein the first oxide layer to the third oxide layer are formed in a thickness ranging from approximately 30 Å to approximately 60 Å.

* * * * *